US010942404B2

United States Patent
Shin et al.

(10) Patent No.: US 10,942,404 B2
(45) Date of Patent: Mar. 9, 2021

(54) DISPLAY DEVICE INCLUDING A COLOR FILTER HAVING AN OPENING ALIGNED WITH A VIRTUAL CENTER LINE OF A PIXEL

(71) Applicant: Samsung Display Co., Ltd., Yongin-si (KR)

(72) Inventors: Dong Hee Shin, Asan-si (KR); Do Yeong Park, Hwaseong-si (KR); Yoo Mi Ra, Ansan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/448,478

(22) Filed: Jun. 21, 2019

(65) Prior Publication Data

US 2020/0073188 A1 Mar. 5, 2020

(30) Foreign Application Priority Data

Aug. 30, 2018 (KR) .......................... 10-2018-0102625

(51) Int. Cl.
*G02F 1/1362* (2006.01)
*H01L 27/12* (2006.01)
(Continued)

(52) U.S. Cl.
CPC ...... *G02F 1/136286* (2013.01); *G02F 1/1368* (2013.01); *G02F 1/133345* (2013.01);
(Continued)

(58) Field of Classification Search
CPC ....... G09G 2300/04; G09G 2300/0421; G09G 2300/0426; G09G 2300/0434; G09G 2300/0439; G09G 2300/0447; G09G 2300/0452; G09G 2300/0495; H01L 27/1214; H01L 27/124; H01L 27/1248;
(Continued)

(56) References Cited

U.S. PATENT DOCUMENTS 8,427,594 B2 * 4/2013 Kim .................... G02F 1/13624
349/37
9,466,617 B2 10/2016 Hong et al.
(Continued)

FOREIGN PATENT DOCUMENTS

KR       10-1462163 B1    11/2014
KR    10-2015-0084578 A    7/2015
KR    10-2017-0115135 A   10/2017

*Primary Examiner* — Sonya McCall-Shepard
(74) *Attorney, Agent, or Firm* — Lewis Roca Rothgerber Christie LLP

(57) ABSTRACT

A display device includes a substrate having a display area including pixels disposed in a matrix form, and a peripheral area; a gate line and a data line on the substrate and insulated from each other; a thin film transistor connected to the gate line and the data line; a passivation layer; a pixel electrode connected to the thin film transistor through a contact hole of the passivation layer; and a color filter overlapped with the thin film transistor and the pixel electrode. The passivation layer is between the thin film transistor and the pixel electrode. The color filter includes an opening overlapping the contact hole. A center of the opening is on a virtual center line of one pixel, and a center of the contact hole is on one side of the virtual center line.

19 Claims, 10 Drawing Sheets

(51) Int. Cl.
*G02F 1/1333* (2006.01)
*G02F 1/1368* (2006.01)

(52) U.S. Cl.
CPC ...... *G02F 1/136227* (2013.01); *H01L 27/124* (2013.01); *H01L 27/1248* (2013.01); *H01L 27/1255* (2013.01); *G02F 2001/136218* (2013.01); *G02F 2001/136222* (2013.01)

(58) Field of Classification Search
CPC ......... G02F 1/136227; G02F 1/136286; G02F 2001/133357; G02F 1/1343–134309; G02F 2001/134318; G02F 1/134336; G02F 1/133509–133514
See application file for complete search history.

(56) References Cited

U.S. PATENT DOCUMENTS

| | | | |
|---|---|---|---|
| 2015/0200211 A1* | 7/2015 | Hong | G02F 1/133345 349/43 |
| 2018/0031890 A1* | 2/2018 | Jung | G02F 1/133514 |
| 2019/0005863 A1* | 1/2019 | Koshihara | G09G 3/3208 |

\* cited by examiner

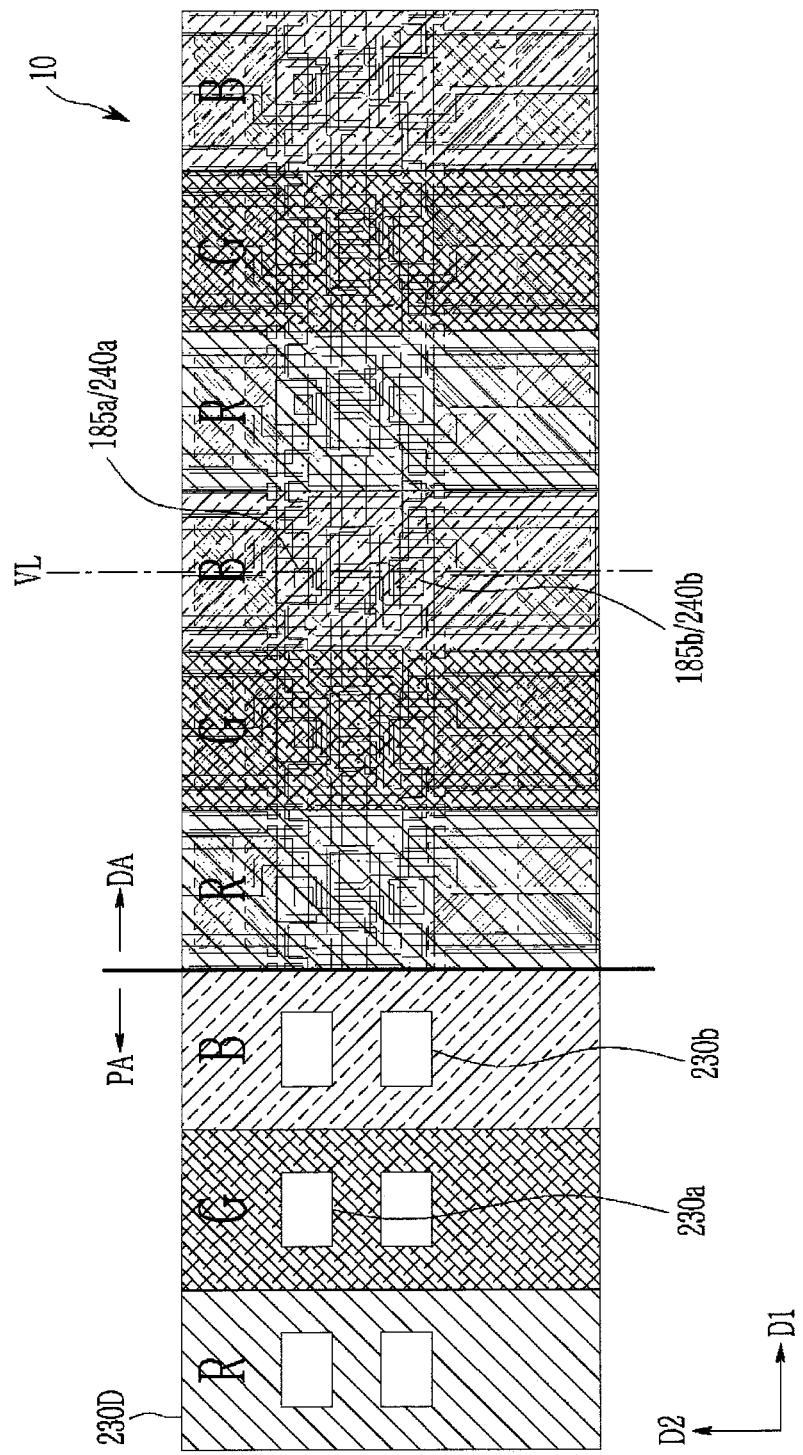

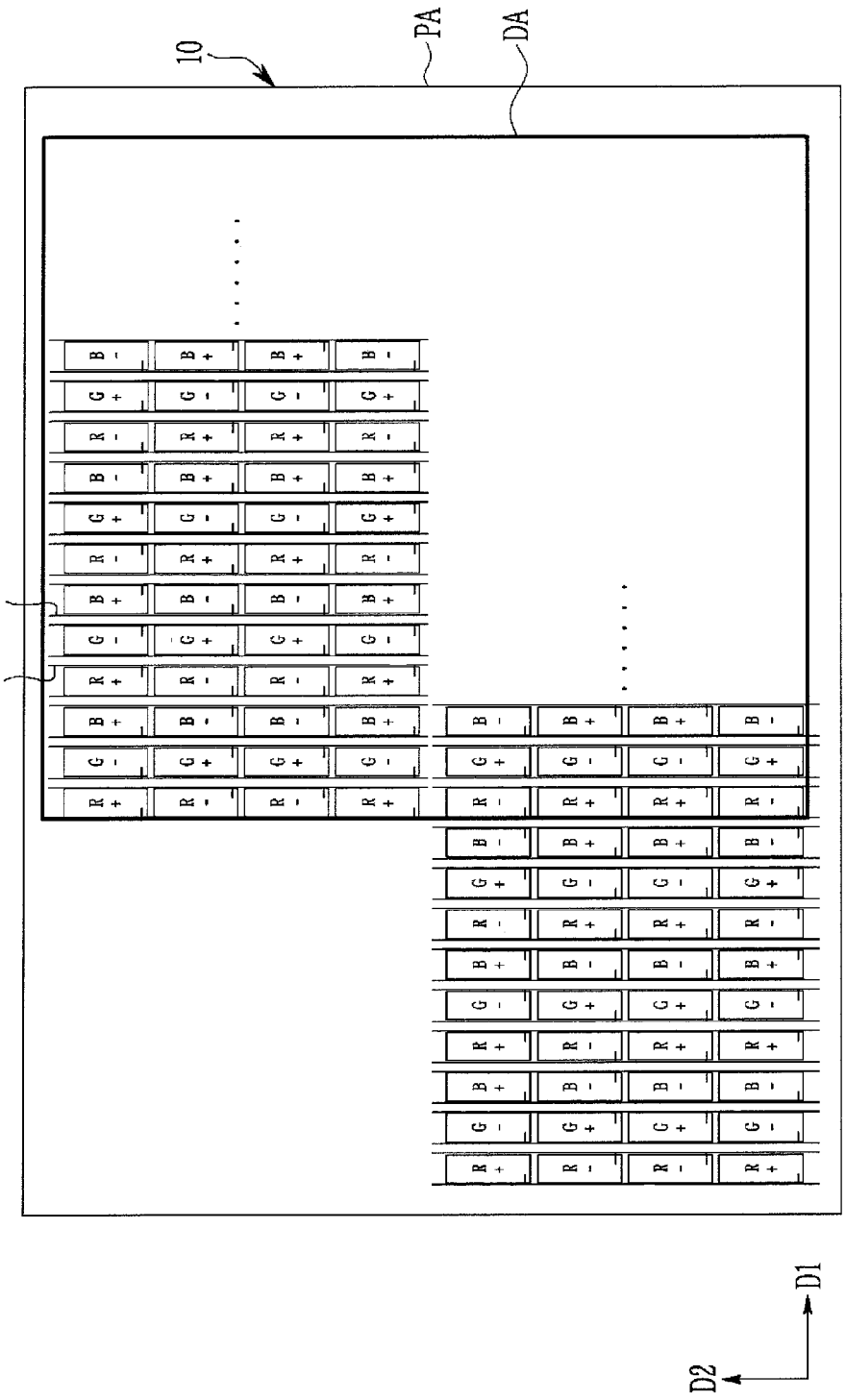

DISPLAY DEVICE INCLUDING A COLOR FILTER HAVING AN OPENING ALIGNED WITH A VIRTUAL CENTER LINE OF A PIXEL

CROSS-REFERENCE TO RELATED APPLICATION

This application claims priority to and the benefit of Korean Patent Application No. 10-2018-0102625 filed in the Korean Intellectual Property Office on Aug. 30, 2018, the entire contents of which are incorporated herein by reference.

BACKGROUND

1. Field

The present disclosure relates to a display device.

2. Description of the Related Art

A liquid crystal display (LCD) is one of the most widely used flat panel displays. Liquid crystal displays include two display panels in which a field generating electrode such as a pixel electrode or a common electrode is formed, and a liquid crystal layer interposed therebetween. In the liquid crystal layer, voltages are applied to the field generating electrodes to generate an electric field in the liquid crystal layer. Then, the alignment of liquid crystal molecules of the liquid crystal layer is determined by the electric field to control the polarization of incident light, thereby displaying images.

The above information disclosed in this Background section is only for enhancement of understanding of the background of the invention and therefore it may contain information that does not form the prior art that is already known in this country to a person of ordinary skill in the art.

SUMMARY

Exemplary embodiments have been made in an effort to provide a display device which has a relatively simple manufacturing process compared to related art devices and in which it is relatively easy to design a dummy color filter.

A display device according to one embodiment of the present disclosure includes a substrate having a display area including pixels in a matrix form, and a peripheral area; a gate line and a data line on the substrate and insulated from each other; a thin film transistor connected to the gate line and the data line; a passivation layer; a pixel electrode connected to the thin film transistor through a contact hole of the passivation layer; and a color filter overlapping the thin film transistor and the pixel electrode. The passivation layer is between the thin film transistor and the pixel electrode. The color filter includes an opening overlapping the contact hole. A center of the opening is on a virtual center line of one pixel, and a center of the contact hole is on one side of the virtual center line.

The virtual center line may extend along a direction in which the data line extends.

The opening of the color filter may have a symmetrical shape in a plan view with respect to the virtual center line.

An area of the contact hole in a plan view may be smaller than an area of the contact hole in a plan view.

A width of the opening may be greater than a width of the contact hole.

The center of the opening may be aligned with the center of the contact hole.

The display device may further include a storage electrode line at a same layer as the gate line, and the storage electrode line may include a protrusion overlapping the contact hole in a plan view.

The storage electrode line may include a horizontal portion extending parallel to the gate line, and the protrusion may protrude from the horizontal portion.

The protrusion may overlap the opening.

The display device may further include a shielding electrode at a same layer as the pixel electrode.

The shielding electrode may extend along a direction in which the gate line extends.

A display device according to another exemplary embodiment of the present disclosure includes a substrate having a display area including pixels arranged in a matrix form, and a peripheral area; a gate line and a data line on the substrate and insulated from each other; a thin film transistor connected to the gate line and the data line; an organic layer; a pixel electrode connected to the thin film transistor through a contact hole of the organic layer; and a color filter overlapping the thin film transistor and the pixel electrode. The organic layer is between the thin film transistor and the pixel electrode. The color filter includes an opening overlapping the contact hole, and a center of the opening is not aligned with a center of the contact hole.

The organic layer may be between the color filter and the pixel electrode.

The display device may further include a dummy color filter in the peripheral area.

According to the exemplary embodiments of the present disclosure, it is possible to provide a display device that is manufactured through a simple process.

BRIEF DESCRIPTION OF THE DRAWINGS

FIG. 9 illustrates a schematic top plan view of a peripheral area and a display area according to an exemplary embodiment.

FIG. 10 illustrates a top plan view of a display device according to a comparative embodiment.

DETAILED DESCRIPTION

Figure 1:
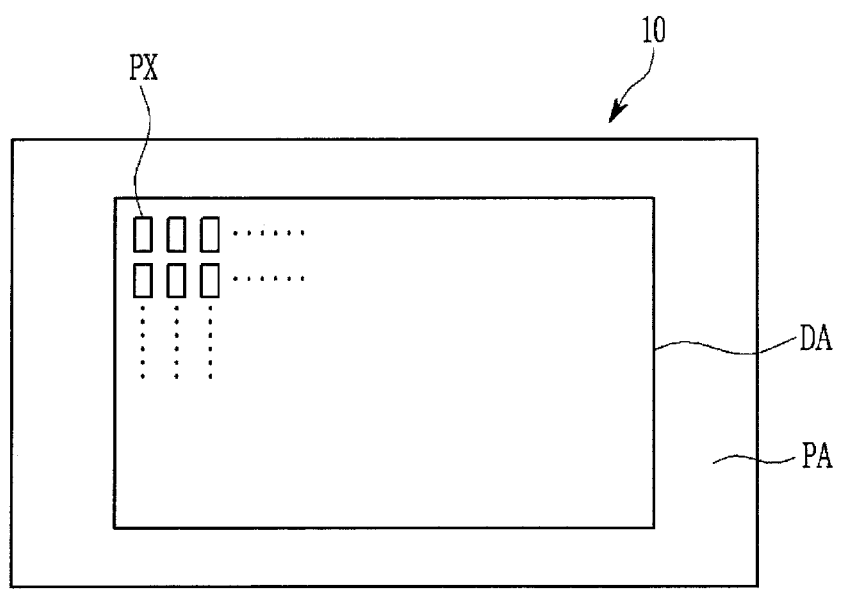
FIG. 1 illustrates a top plan view of a display device according to an exemplary embodiment.
Figure 1:
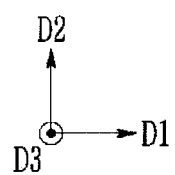

The present disclosure will be described more fully hereinafter with reference to the accompanying drawings, in which exemplary embodiments of the present disclosure are shown. As those skilled in the art would realize, the described embodiments may be modified in various different ways, all without departing from the spirit or scope of the present disclosure.

To clearly describe the embodiments of the present disclosure, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the present disclosure is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the word "over" or "on" means positioning on or below the object portion, and does not necessarily mean positioning on the upper side of the object portion based on a gravity direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

Figure 2:
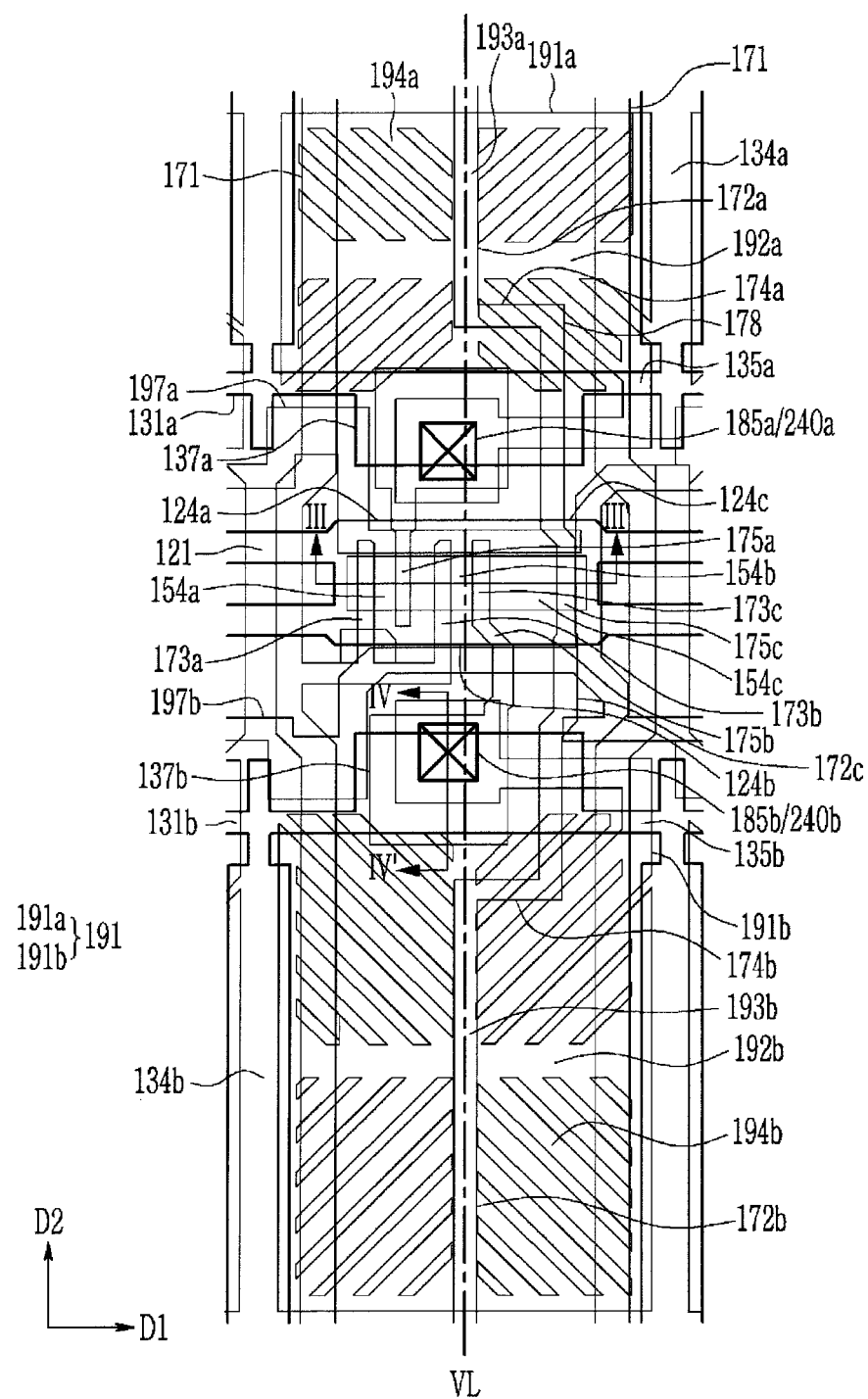
FIG. 2 illustrates a top plan view of a pixel of a display device according to an exemplary embodiment.
Figure 3:
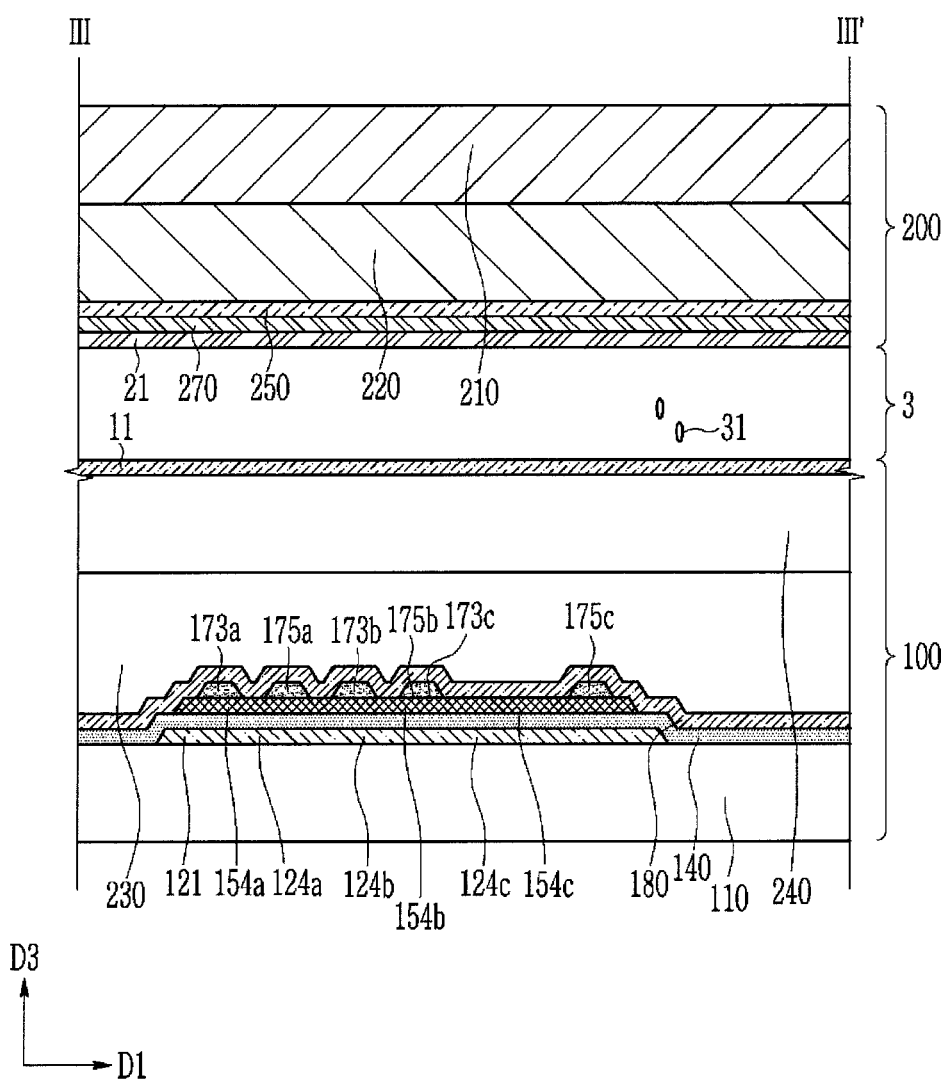
FIG. 3 illustrates a cross-sectional view taken along a line III-III' FIG. 2.
Figure 4:
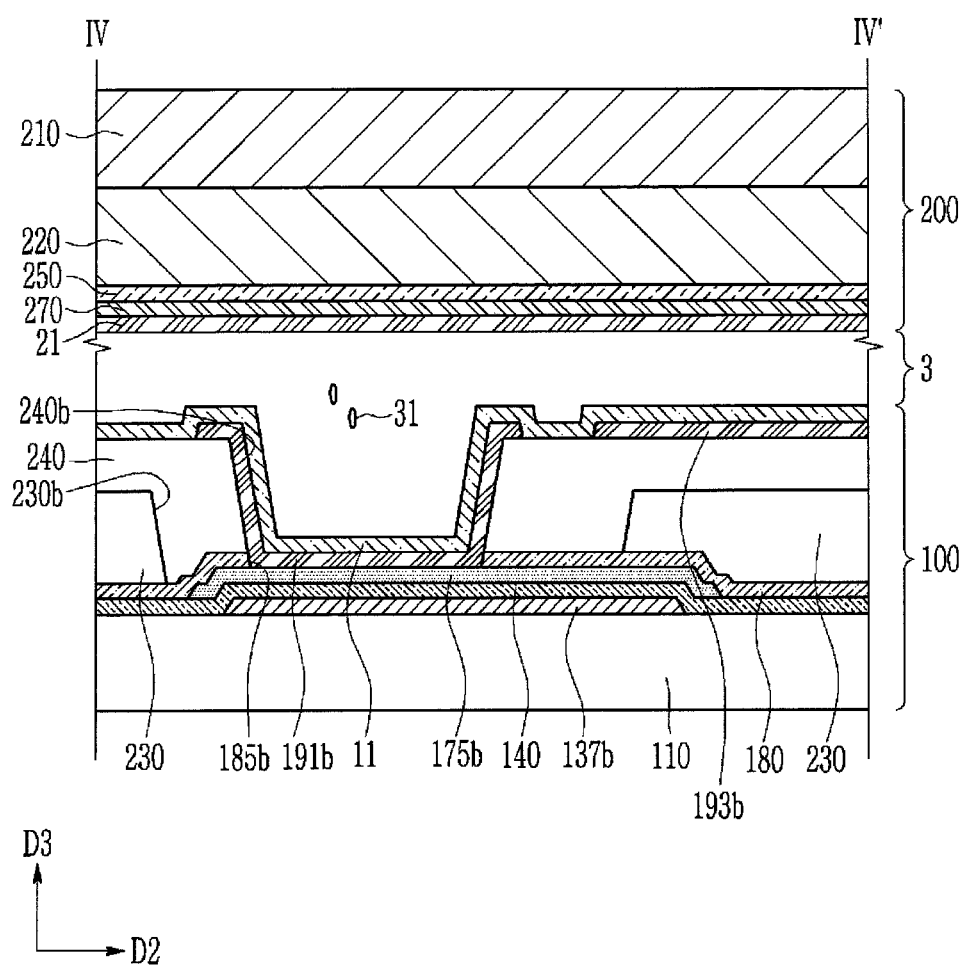
FIG. 4 illustrates a cross-sectional view taken along a line IV-IV' of FIG. 2.

A display device according to an exemplary embodiment will now be described with reference to FIG. 1 to FIG. 4. FIG. 1 illustrates a top plan view of a, display device according to an exemplary embodiment, FIG. 2 illustrates a top plan view of a pixel of a display device according to an exemplary embodiment, FIG. 3 illustrates a cross-sectional view taken along a line FIG. 2, and FIG. 4 illustrates a cross-sectional view taken along a line IV-IV' of FIG. 2.

Referring to FIG. 1, a display device 10 according to an exemplary embodiment includes a display area DA in which a plurality of pixels PX are disposed in a matrix form along a first direction D1 and a second direction D2, and a peripheral area PA disposed at an edge surrounding the display area DA.

One pixel PX of a plurality of pixels PX disposed in the display area will now be described with reference to FIG. 2 to FIG. 4. The display device according to the present exemplary embodiment includes a lower display panel 100 and an upper display panel 200 which face each other, and a liquid crystal layer 3 disposed between the lower display panel 100 and the upper display panel 200.

First, the lower display panel 100 will be described.

A gate conductor including a first gate line 121 and storage electrode lines 131a and 131b is disposed on a first substrate 110 made of transparent glass or plastic.

The gate line 121 includes a first gate electrode 124a, a second gate electrode 124b, a third gate electrode 124c, and a wide end portion (not shown) for connection to another layer or an external driving circuit.

The gate line 121 and the storage electrode lines 131a and 131b may be made of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), and titanium (Ti). The gate line 121 and the storage electrode lines 131a and 131b may have a multilayered structure including at least two conductive layers having different physical properties.

The gate line 121 traverses one pixel along the first direction D1. A first subpixel electrode 191a indicating a high gray is disposed in a direction +D2 relative to the gate line 121, and a second subpixel electrode 191b indicating a low gray is disposed in a direction −D2 relative to the gate line 121, and vice versa.

The storage electrode lines 131a and 131b may be made of a same material as the gate line 121, and may be formed by a simultaneous process with the gate line 121.

The first storage electrode line 131a disposed at an upper side of the gate line 121 may overlap an edge of the first subpixel electrode 191a. The first storage electrode line 131a may include two vertical portions 134a, and a horizontal portion 135a that connects the vertical portions 134a. In one embodiment, the horizontal portion 135a of the first storage electrode line 131a may extend beyond one pixel area to be connected to another layer or an external driving circuit.

The second storage electrode line 131b disposed at a lower side of the gate line 121 may overlap an edge of the second subpixel electrode 191b. The second storage electrode line 131b may include two vertical portions 134b, and a horizontal portion 135b that connects the vertical portions 134a.

In addition, according to the present exemplary embodiment, the first storage electrode line 131a may include a first protrusion 137a, and the second storage electrode line 131b may include a second protrusion 137b. Each of the first protrusion 137a and the second protrusion 137b may prevent or at least mitigate against a light leakage phenomenon.

Each of the first protrusion 137a and the second protrusion 137b may have a quadrangular shape protruding from the horizontal portions 135a and 135b in a plan view, but the present disclosure is not limited thereto. Each of the first protrusion 137a and the second protrusion 137b may have any form for blocking a region where a light leakage phenomenon may occur.

The first protrusion 137a may overlap a contact hole 185a of a passivation layer 180 to be described later, an opening 230a of a color filter 230, and a contact hole 240a of an organic layer 240.

The first protrusion 137a may overlap an extended region of the first drain electrode 175a and an extended region of the first subpixel electrode 191a. The first protrusion 137a may overlap the first drain electrode 175a and the first subpixel electrode 191a.

The second protrusion 137b may overlap a contact hole 185b of the passivation layer 180 to be described later, an opening 230b of the color filter 230, and a contact hole 240b of the organic layer 240.

The second protrusion 137b may overlap an extended region of the second drain electrode 175b and an extended region of the second subpixel electrode 191b. The second protrusion 137b may overlap the second drain electrode 175b and the second subpixel electrode 191b.

Although this specification describes and illustrates the shape of the storage electrode lines 131a and 131b as described above, it is not limited to such a shape, and may have any shape for performing the same or similar function.

A gate insulating layer 140 is disposed on the gate conductor. The gate insulating layer 140 may be made of an inorganic insulating layer material such as a silicon nitride or a silicon oxide, but may be made of an organic insulator material without being limited thereto.

A first semiconductor layer 154a, a second semiconductor layer 154b, and a third semiconductor layer 154c are disposed on the gate insulating layer 140.

A data conductor including a data line 171, a first source electrode 173a, a second source electrode 173b, a third source electrode 173c, a first drain electrode 175a, a second drain electrode 175b, a third drain electrode 175c, and a divided reference voltage line 178 are disposed on the gate insulating layer 140, the first semiconductor layer 154a, the second semiconductor layer 154b, and the third semiconductor layer 154c.

The data line 171 extends in the direction D2 along an edge of one pixel area, and includes the first source electrode 173a and the second source electrode 173b.

The first drain electrode 175a overlaps the first source electrode 173a along the direction D1 in a plan view, and may have an I-shape overlapping the first source electrode 173a. The first drain electrode 175a includes a wide extended region connected to the first subpixel electrode 191a.

The second drain electrode 175b overlaps the second source electrode 173b along the direction D1 in a plan view, and may have an I-shape overlapping the second source electrode 173b. The second drain electrode 175b includes a wide extended region connected to the second subpixel electrode 191b.

The third source electrode 173c may be disposed adjacent to the second drain electrode 175b. The third source electrode 173c may be a region extending from the second drain electrode 175b.

The divided reference voltage line 178 includes the third drain electrode 175c. The third drain electrode 175c may constitute a thin film transistor together with the third source electrode 173c.

The divided reference voltage line 178 includes a plurality of vertical portions 172a, 172b, and 172c, and horizontal portions 174a and 174b connecting the vertical portions 172a, 172b, and 172c.

The first vertical portion 172a included in the divided reference voltage line 178 may overlap a first vertical stem 193a of the first subpixel electrode 191a. The second vertical portion 172b may overlap a second vertical stem 193b of the second subpixel electrode 191b. The third vertical portion 172c included in the divided reference voltage line 178 may also traverse a region disposed between a region in which the first subpixel electrode 191a is disposed and a region in which the second subpixel electrode 191b is disposed.

The divided reference voltage line 178 may include the first horizontal portion 174a connecting the first vertical portion 172a and the third vertical portion 172c and the second horizontal portion 174b connecting the second vertical portion 172b and the third vertical portion 172c.

The first horizontal portion 174a may overlap the first subpixel electrode 191a, and the second horizontal portion 174b may overlap the second subpixel electrode 191b. However, the first horizontal portion 174a and the second horizontal portion 174b may be disposed in a region that does not overlap with the first subpixel electrode 191a and the second subpixel electrode 191b and the present disclosure is not limited to any particular shapes.

The above-described reference voltage line 178 may have a shape corresponding to the shape of the pixel electrode 191, and the shape of the pixel electrode 191 may be varied, thereby changing the shape of the voltage reference line 178.

A portion of the divided reference voltage line 178 disposed in the region overlapping the third semiconductor layer 154c may serve as the third drain electrode 175c.

The first gate electrode 124a, the first source electrode 173a, and the first drain electrode 175a constitute one first thin film transistor (TFT) together with the first semiconductor layer 154a, and a channel of the first thin film transistor is formed in the first semiconductor layer 154a between the first source electrode 173a and the first drain electrode 175a. The second gate electrode 124b, the second source electrode 173b, and the second drain electrode 175b constitute one second thin film transistor together with the second semiconductor layer 154b, and a channel thereof is formed in the second semiconductor layer 154b between the second source electrode 173b and the second drain electrode 175b. The third gate electrode 124c, the third source electrode 173c, and the third drain electrode 175c constitute one third thin film transistor together with the third semiconductor layer 154c, and a channel thereof is formed in the third semiconductor layer 154c disposed between the third source electrode 173c and the third drain electrode 175c.

The passivation layer 180 is disposed in the data conductor and the exposed semiconductor layers 154a, 154b, and 154c.

The passivation layer 180 may be made of an inorganic insulating film material such as a silicon nitride or a silicon oxide. When the color filter 230 is disposed in the passivation layer 180, the passivation layer 180 may prevent pigment of the color filter 230 from flowing into the exposed semiconductor layers 154a, 154b, and 154c.

The passivation layer 180 may include the first contact hole 185a and the second contact hole 185b. The first contact hole 185a may overlap the first drain electrode 175a and the first subpixel electrode 191a. The second contact hole 185b may overlap the second drain electrode 175b and the second subpixel electrode 191b.

The color filter 230 is disposed on the passivation layer 180 and may uniquely display one of primary colors, and the primary colors may be, for example, three primary colors such as red, green, and blue, or yellow, cyan, and magenta, and the like. Although not illustrated, a color filter for displaying mixed colors of the primary colors or white, as well as the primary colors, may be further included.

Hereinafter, an opening included in the color filter 230 will be described in detail with reference to FIG. 5 to FIG. 8.

The organic layer 240 is disposed on the color filter 230. The organic layer 240 may flatten a surface on which a pixel electrode 191 described later is disposed.

The organic layer 240 includes the third contact hole 240a and the fourth contact hole 240b. The third contact hole 240a may be aligned with the first contact hole 185a included in the passivation layer 180. The fourth contact hole 240b may be aligned with the second contact hole 185b included in the passivation layer 180.

The first drain electrode 175a and the first subpixel electrode 191a may be connected through the first contact hole 185a and the third contact hole 240a. The second drain electrode 175b and the second subpixel electrode 191b may be connected through the second contact hole 185b and the fourth contact hole 240b.

The pixel electrode 191 is disposed on the color filter 230. The pixel electrode 191 includes the first subpixel electrode 191a and the second subpixel electrode 191b which are spaced apart from each other with the gate line 121 therebetween and are adjacent to each other along the direction D2.

The pixel electrode 191 may be made of a transparent material such as ITO and IZO. The pixel electrode 191 may be made of a transparent conductive material such as ITO or IZO, or a reflective metal such as aluminum, silver, chromium, or an alloy thereof.

Shielding electrodes 197a and 197b made of a same material as the pixel electrode 191 are disposed on a same layer as the pixel electrode 191, on the color filter 230. The pixel electrodes 191 and the shielding electrodes 197a and 197b may be formed simultaneously in a same process.

The first subpixel electrode 191a has a first horizontal stem 192a extending in the direction D1, the first vertical stem 193a that is orthogonal to the first horizontal stem 192a and extends in the direction D2, and a plurality of first minute branches 194a that extend in a diagonal direction from the first vertical stem 193a. A minute slit from which an electrode is removed may be disposed between adjacent first minute branches 194a.

An acute angle formed by the first minute branches 194a with respect to the first horizontal stem 192a or the first vertical stem 193a may be in a range of about 40° to about 45°, but is not limited thereto, and may be appropriately adjusted based on consideration of display characteristics, such as visibility of a liquid crystal display.

The first subpixel electrode 191a includes a wide region extending from a portion of the first minute branches 194a, and may be connected to the first drain electrode 175a through the wide region.

The second subpixel electrode 191b has a second horizontal stem 192b extending in the direction D1, the second vertical stem 193b that is orthogonal to the second horizontal stem 192b and extends in the direction D2, and a plurality of second minute branches 194b that extend in a diagonal direction from the first vertical stem 193a. A minute slit from which an electrode is removed may be disposed between adjacent second minute branches 194b.

An acute angle formed by the second minute branches 194b with respect to the second horizontal stem 192b or the second vertical stem 193b may be in a range of about 40° to about 45°, but is not limited thereto, and may be appropriately adjusted based on consideration of display characteristics, such as visibility of a liquid crystal display.

The second subpixel electrode 191b includes a wide region extended from a portion of the second minute branches 194b, and may be connected to the second drain electrode 175b through the wide region.

The shielding electrodes 197a and 197b may be disposed between the first subpixel electrode 191a and the second subpixel electrode 191b, and may have a shape that extends along the direction D1. Their shape and position are not limited thereto.

The shielding electrodes 197a and 197b receive a same voltage as a common electrode 270 (see FIG. 3). No electric field is generated between the shielding electrodes 197a and 197b and the common electrode, and liquid crystal molecules 31 (see FIG. 3) disposed therebetween are not arranged. Liquid crystal molecules 31 between the shielding electrodes 197a and 197b and the common electrode 270 are in a black state. As such, when the liquid crystal molecules 31 are in a black state, the liquid crystal molecules 31 themselves may function as a light blocking member.

A first alignment layer 11 may be disposed on the pixel electrode 191.

Next, the upper display panel 200 will be described.

A second substrate 210 that is made of transparent glass or plastic overlaps the first substrate 110. A light blocking member 220 is disposed between the second substrate 210 and the liquid crystal layer 3. The light blocking member 220 is also called a black matrix and serves to prevent or at least mitigate against light leakage.

Although this specification has described the configuration in which the light blocking member 220 is disposed in the upper display panel 200, it is not limited thereto, and it may be disposed in the lower display panel 100.

An overcoat 250 is disposed between the light blocking member 220 and the liquid crystal layer 3. The overcoat 250 may be made of an organic insulating material. The overcoat 250 prevents the light blocking member 220 from being exposed and provides a flat surface. According to one or more embodiments, the overcoat 250 may be omitted.

The common electrode 270 is disposed between the overcoat 250 and the liquid crystal layer 3. The common electrode 270 may include a same material as the pixel electrode 191. The common electrode 270 is formed with a planar shape and receives a common voltage.

A second alignment layer 21 may be disposed between the common electrode 270 and the liquid crystal layer 3.

The liquid crystal layer 3 is disposed between the lower display panel 100 and the upper display panel 200. The liquid crystal layer 3 has negative dielectric anisotropy, and the liquid crystal molecules 31 of the liquid crystal layer 3 may be perpendicular to a surface of the two display panels 100 and 200 in the absence of an electric field. Alternatively, the liquid crystal molecules 31 of the liquid crystal layer 3 may be arranged parallel to the surfaces of the two display panels 100 and 200 in the absence of an electric field.

The first subpixel electrode 191a and the second subpixel electrode 191b to which the data voltage is applied generate an electric field together with the common electrode 270 of the upper display panel 200, to determine an orientation of the liquid crystal molecules 31 in the liquid crystal layer 3. The luminance of light passing through the liquid crystal layer 3 is controlled according to the determined orientation of the liquid crystal molecules 31.

Figure 5:
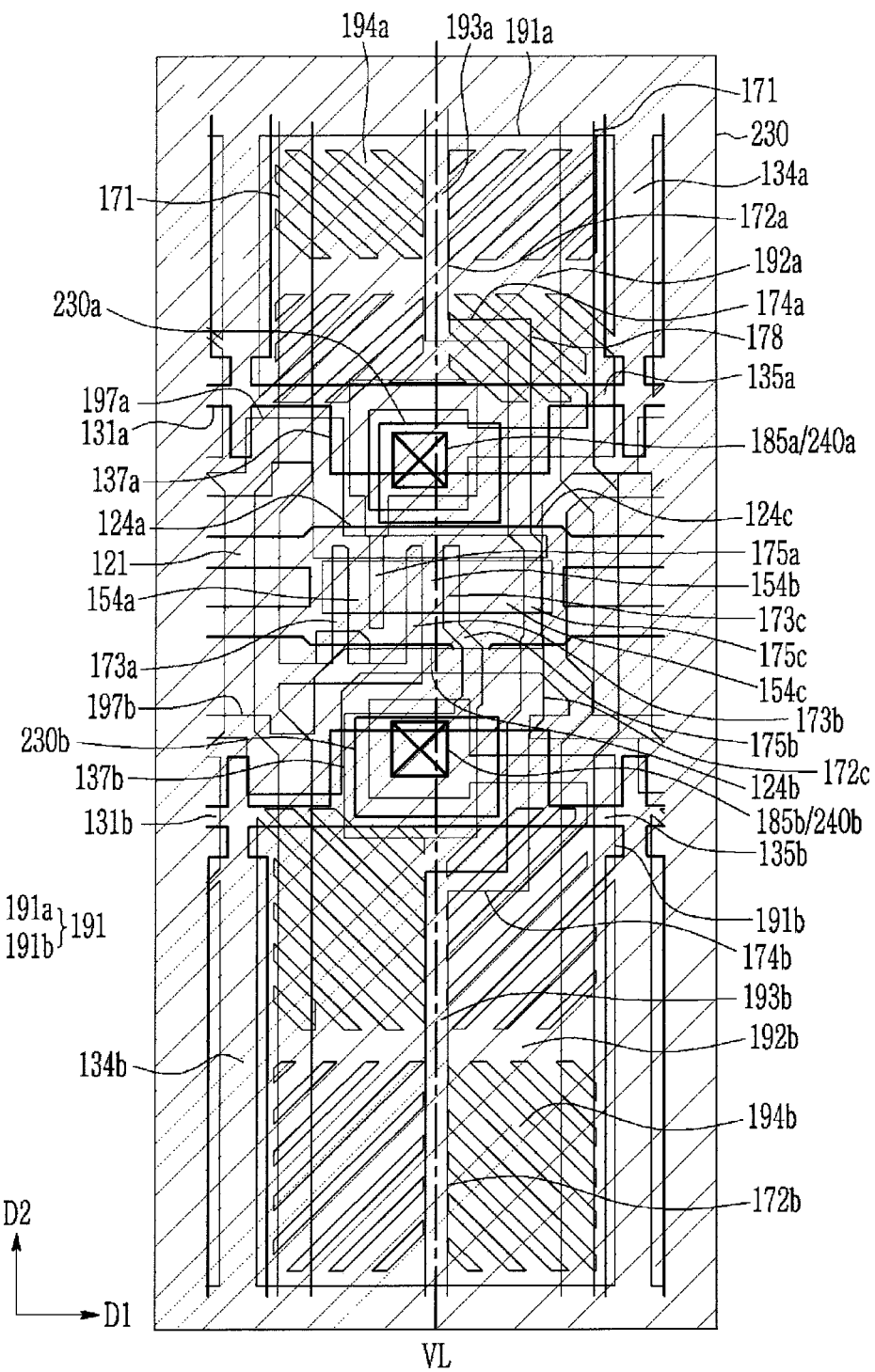
FIG. 5 illustrates a top plan view of a pixel according to an exemplary embodiment.
Figure 7:
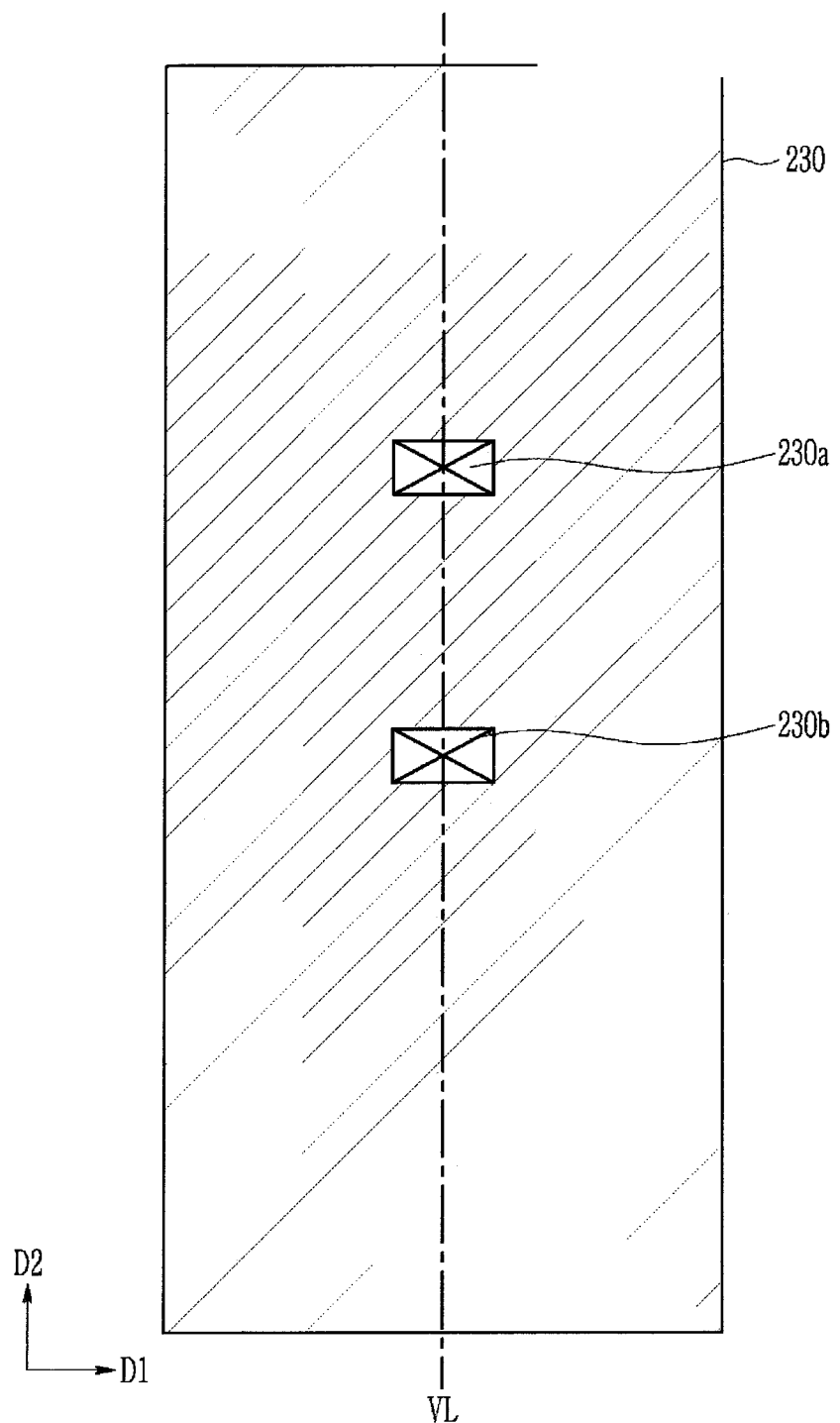
FIG. 7 illustrates a top plan view of a color filter according to an exemplary embodiment.
Figure 8:
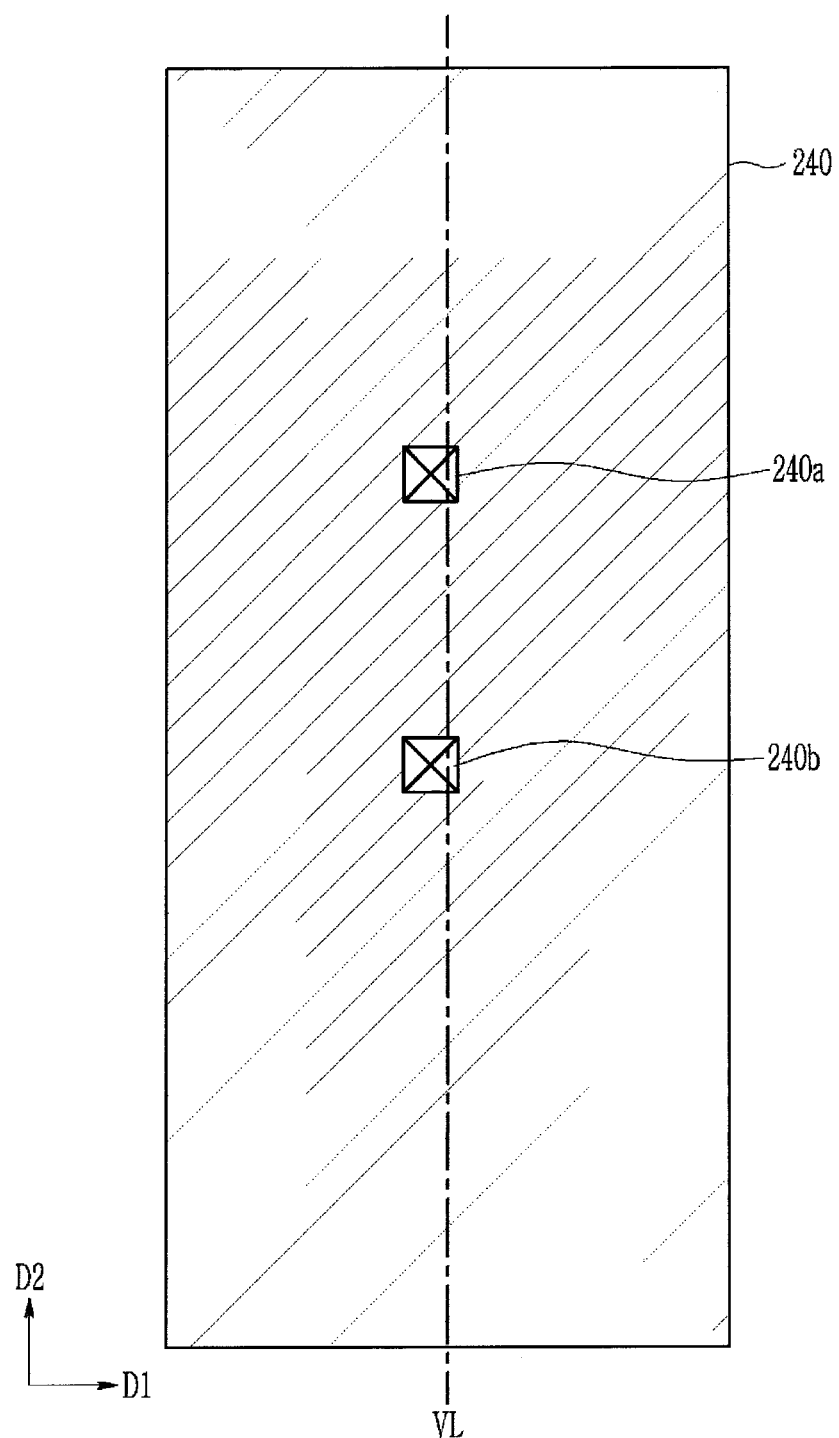
FIG. 8 illustrates a top plan view of an organic layer according to an exemplary embodiment.

Hereinafter, a positional relationship between the openings 230a and 230b of the color filter 230 and the contact holes 185a and 185b of the passivation layer 180 or a positional relationship between the openings 230a and 230b of the color filter 230 and the contact holes 240a and 240b of the organic layer 240 will be described with reference to FIG. 5 to FIG. 8. FIG. 5 illustrates a top plan view of a pixel according to an exemplary embodiment, FIG. 6 illustrates a top plan view of a passivation layer included in one pixel, FIG. 7 illustrates a top plan view of a color filter included in one pixel, and FIG. 8 illustrates a top plan view of an organic layer included in one pixel.

As illustrated in FIG. 5, a virtual center line VL which extends along the direction D2 and crosses a center of one pixel may overlap the first vertical stem 193a of the first subpixel electrode 191a, the second vertical stem 193b of the second subpixel electrode 191b, and the first vertical portion 172a and the second vertical portion 172b of the divided reference voltage line 178.

Figure 6:
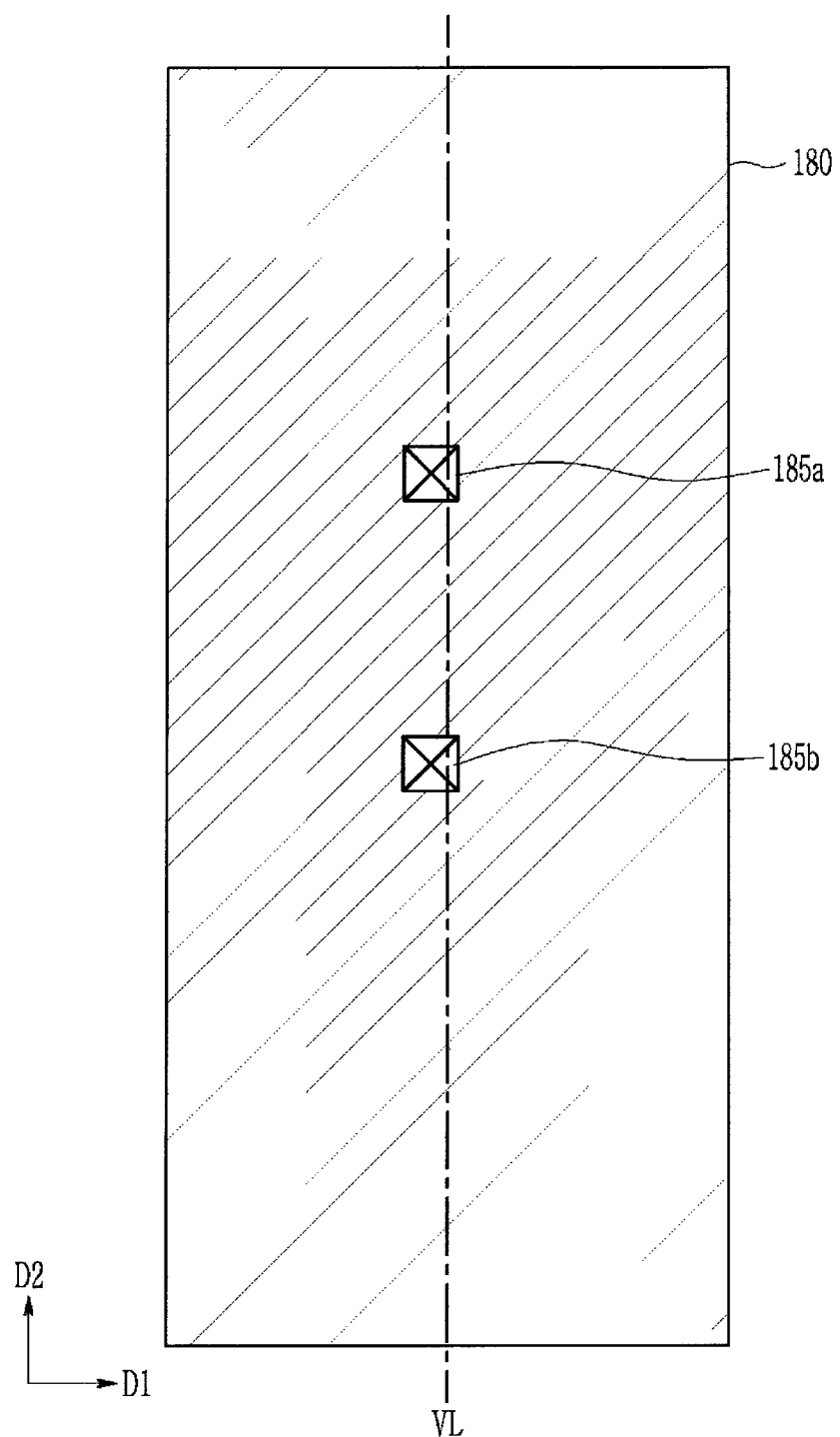
FIG. 6 illustrates a top plan view of a passivation layer according to an exemplary embodiment.

As illustrated in FIG. 5 and FIG. 6, the passivation layer 180 includes the first contact hole 185a overlapping the first drain electrode 175a and the first subpixel electrode 191a, and the second contact hole 185b overlapping the second drain electrode 175b and the second subpixel electrode 191b.

The first drain electrode 175a and the first subpixel electrode 191a may be connected through the first contact hole 185a, and the second drain electrode 175b and the second subpixel electrode 191b may be connected through the second contact hole 185b.

The first contact hole 185a may overlap the first protrusion 137a of the storage electrode line 131, and the second contact hole 185b may overlap the second protrusion 137b of the storage electrode line 131.

According to an exemplary embodiment, the first contact hole 185a and the second contact hole 185b may be biased to one side of the virtual center line VL. Although the present disclosure illustrates the exemplary embodiment in which the first contact hole 185a and the second contact hole 185b included in one pixel are disposed at a left side of the virtual center line VL, the first contact hole 185a and the second contact hole 185b included in another pixel may be disposed at a right side of the virtual center line VL, without being limited thereto.

In one embodiment, when the data line 171 connected to the pixel electrode 191 disposed at one pixel is disposed at a left side of the pixel electrode 191, the thin film transistor connected to the pixel electrode 191 may be disposed at the left side of the virtual center line VL (see FIG. 5). Accordingly, the first contact hole 185a and the second contact hole 185b through which the pixel electrode 191 and the thin film transistor are connected with each other may be disposed at the left side of the virtual center line VL.

In contrast, when the data line 171 connected to the pixel electrode 191 disposed at one pixel is disposed at a right side of the pixel electrode 191, the thin film transistor connected to the pixel electrode 191 may be disposed at the right side of the virtual center line VL Accordingly, the first contact hole 185a and the second contact hole 185b through which the pixel electrode 191 and the thin film transistor are connected with each other may be disposed at the right side of the virtual center line VL.

As illustrated in FIG. 5 and FIG. 7, the color filter 230 overlapping one pixel includes the first opening 230a that overlaps a region in which the first drain electrode 175a and the first subpixel electrode 191a are connected. The color filter 230 includes the second opening 230b overlapping a region where the second drain electrode 175b and the second subpixel electrode 191b are connected.

A center of the first opening 230a and the second opening 230b of the color filter 230 may be disposed on the virtual center line VL. In other words, the first opening 230a and the second opening 230b of the color filter 230 may be disposed on a center line of one pixel (e.g., the first opening 230a and the second opening 230b of the color filter 230 may each be centered about the virtual center line VL).

Each of the first opening 230a and the second opening 230b may have a symmetric shape in a plan view with respect to the virtual center line VL, but the present disclosure is not limited thereto, and the first opening 230a and the second opening 230b may have any suitable shape.

The first opening 230a may overlap the first drain electrode 175a and the first subpixel electrode 191a. The second opening 230b may overlap the second drain electrode 175b and the second subpixel electrode 191b.

The contact hole 240a of the organic layer 240 to be described later and the contact hole 185a of the passivation layer 180 may be disposed inside the first opening 230a. The first subpixel electrode 191a and the first drain electrode 175a may be connected through the contact hole disposed inside the first opening 230a.

In addition, the contact hole 240b of the organic layer 240 to be described later and the contact hole 185b of the passivation layer 180 may be disposed inside the second opening 230b. The second subpixel electrode 191b and the second drain electrode 175b may be connected through the contact hole disposed inside the second opening 230b.

In one or more embodiments, the organic layer 240 illustrated in FIG. 8 may have a same shape as the above-mentioned passivation layer 180.

The organic layer 240 includes the third contact hole 240a that overlaps one pixel and is disposed at a region where the first drain electrode 175a and the first subpixel electrode 191a are overlapped with each other. Further, the organic layer 240 includes the fourth contact hole 240b disposed in a region where the second drain electrode 175b overlaps the second subpixel electrode 191b.

Centers of the third contact hole 240a and the fourth contact hole 240b of the organic layer 240 may be disposed at one side of the virtual center line VL. Although the present disclosure illustrates the exemplary embodiment in which the third contact hole 240a and the fourth contact hole 240b included in one pixel are disposed at a left side of the virtual center line VL, the first contact hole 185a and the second contact hole 185b included in another pixel may be disposed at a right side of the virtual center line VL, without being limited thereto.

As illustrated in FIG. 5, when the data line 171 connected to the pixel electrode 191 disposed at one pixel is disposed at a left side of the pixel electrode 191, the thin film transistor connected to the pixel electrode 191 may be disposed at the left side of the virtual center line VL. The third contact hole 240a and the fourth contact hole 240b through which the pixel electrode 191 and the thin film transistor are connected with each other may be disposed at the left side of the virtual center line VL.

In contrast, when the data line 171 connected to the pixel electrode 191 disposed at one pixel is disposed at a right side of the pixel electrode 191, the thin film transistor connected to the pixel electrode 191 may be disposed at the right side of the virtual center line VL. The third contact hole 240a and the fourth contact hole 240b through which the pixel electrode 191 and the thin film transistor are connected with each other may be disposed at the right side of the virtual center line VL.

The third contact hole 240a may be aligned with an edge of the first contact hole 185a of the passivation layer 180. The third contact hole 240a may overlap the first contact hole 185a and substantially form one contact hole. The first drain electrode 175a and the first subpixel electrode 191a may be connected through the first contact hole 185a and the third contact hole 240a.

The fourth contact hole 240b may be aligned with an edge of the second contact hole 185b of the passivation layer 180. The fourth contact hole 240b may overlap the second contact hole 185b and substantially form one contact hole. The second drain electrode 175b and the second subpixel electrode 191b may be connected through the second contact hole 185b and the fourth contact hole 240b.

Hereinafter, one opening included in the color filter 230 and one contact hole included in the passivation layer 180 will be described. The contact hole included in the passivation layer 180 may be replaced with a contact hole included in the organic layer 240.

An area of the openings 230a and 230b included in the color filter 230 may be greater than an area occupied by the contact holes 185a, 185b, 240a, and 240b in a plan view. A length of the openings 230a and 230b in the horizontal direction (direction D1) may be greater than a length of the contact holes 185a, 185b, 240a, and 240b in the horizontal direction. In addition, a length of the openings 230a and 230b in the vertical direction (direction D2) may greater than a length of the contact holes 185a, 185b, 240a, and 240b in the vertical direction. In other words, a width of the openings 230*a* and 230*b* in the direction D1 may be greater than a width of the contact holes 185*a*, 185*b*, 240*a*, and 240*b* in the direction D1, and a width of the openings 230*a* and 230*b* in the direction D2 may be greater than a width of the contact holes 185*a*, 185*b*, 240*a*, and 240*b* in the direction D2.

The centers of the openings 230*a* and 230*b* are disposed on the virtual center line VL, and the centers of the contact holes 185*a*, 185*b*, 240*a*, and 240*b* are not disposed on the virtual center line VL. The centers of the contact holes 185*a*, 185*b*, 240*a*, and 240*b* may have a shape that is biased from the virtual center line VL to one side thereof. The centers of the openings 230*a* and 230*b* and the centers of the contact holes 185*a*, 185*b*, 240*a*, and 240*b* may not be aligned with each other, and may be separated from each other in a plan view.

According to an exemplary embodiment, the contact holes of the organic layer 240 and the passivation layer 180 may be disposed at one side of the virtual center line, while the color filter 230 may include the openings 230*a* and 230*b* having centers that are disposed on the virtual center line, thereby simplifying a mask pattern that is necessary for manufacturing the color filter 230. In addition, it is possible to simplify a manufacturing process of the color filter 230 disposed in the peripheral area, because the direction of the openings included in the color filter 230 is not required to be aligned with the direction in which the contact holes are disposed.

This will be described in more detail with reference to FIG. 9 and FIG. 10. FIG. 9 illustrates a schematic top plan view of a peripheral area and a display area according to an exemplary embodiment, and FIG. 10 illustrates a schematic top plan view of a plurality of pixels disposed in a display device according to an exemplary embodiment.

As shown in FIG. 9, the display device 10 may include a display area DA in which one pixel illustrated in FIG. 2 or FIG. 5 is disposed in a matrix form, and a peripheral area PA.

The pixel having the shape illustrated in FIG. 2 or FIG. 5 may be disposed in the display area DA, and a dummy color filter 230D may be disposed in the peripheral area PA together with some signal lines (not illustrated) extending from the display area DA.

Some of a plurality of pixels disposed in the display area may include contact holes each having a center disposed at a left side of the virtual center line VL for each pixel, and the other pixels may include contact holes disposed at a right side of the virtual center line VL.

For example, in three pixels disposed near a boundary between the display area DA and the peripheral area PA as illustrated in FIG. 2 or FIG. 5, the data line connected to the pixel electrode may be disposed at a left side of the pixel electrode, and the contact hole may be disposed at the left side of the virtual center line. In addition, in the three pixels arranged in the direction D1, the data line connected to the pixel electrode may be disposed at the right side of the pixel electrode, and the center of the contact hole may be disposed at the right side of the virtual center line.

Centers of the color filter 230 disposed in the display area DA and the opening of the dummy color filter 230 disposed in the peripheral area PA may be disposed on the virtual center line. Openings of the color filter 230 and the dummy color filter 230D may have a symmetrical shape in a plan view with respect to the virtual center line.

In one embodiment, referring to the pixels illustrated at a top of FIG. 10, the pixels disposed within the display area DA may be repeated with respect to three pixels along the direction D1. The pixels may also be repeated with respect to three pixels along the direction D2. In this case, one pixel indicates one pixel illustrated in FIG. 2 or FIG. 5.

Referring to FIG. 10, one pixel disposed at a first row and a first column of the display area DA may be connected to the thin film transistor connected to the data line 171 disposed at a left side of one pixel electrode, as an example. Similarly, each of the pixel electrodes disposed in a second row and a first column and a third row and the first column may be connected to the thin film transistor connected to the data line 171 disposed at the right side of the pixel electrode. A state in which the pixel electrode and the thin film transistor are connected is shown as a straight line protruding from the data line 171.

In one embodiment, a mask for forming the color filter may be disposed in the peripheral area PA in order to form the dummy color filter disposed in the peripheral area PA. In this case, when the opening of the filter is disposed at one side of the virtual center line, the alignment between the contact hole and the opening of the color filter should be considered.

As an example, a mask pattern corresponding to 9 columns such as a plurality of pixels illustrated at the bottom of FIG. 10 are disposed in the peripheral area PA so that the opening of the color filter disposed in the display area DA and the contact hole exposing a portion of the drain electrode may be arranged at the same position (at a left or right side of the virtual center line). In this case, since the dummy color filter reaches 9 columns, there is a problem that the width occupied by the peripheral area is increased.

However, according to an exemplary embodiment, the center of the opening of the color filter is disposed on the virtual center line of one pixel across the display area DA and the peripheral area PA. It is not necessary to form a relatively large number of dummy color filters 230D as shown in FIG. 9, and it is possible to provide an opening overlapping a region where the thin film transistor and the pixel electrode overlap each other (a region in which the contact hole is formed) while forming a relatively small number of dummy color filters 230D.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

110: first substrate
121: gate line
171: data line
180: passivation layer
185*a*, 185*b*, 240*a*, 240*b*: contact hole
191: pixel electrode
230: color filter
230*a*, 230*b*: opening
VL: virtual center line

What is claimed is:

1. A display device comprising:
   a substrate comprising a display area including pixels arranged in a matrix form, and a peripheral area;
   a gate line and a data line on the substrate, the gate line and the date line insulated from each other;
   a thin film transistor connected to the gate line and the data line;
   a passivation layer;

a pixel electrode connected to the thin film transistor through a contact hole of the passivation layer, the passivation layer being between the thin film transistor and the pixel electrode; and a color filter overlapping the thin film transistor and the pixel electrode, wherein the color filter includes an opening overlapping the contact hole, wherein a center of the opening is on a virtual center line of one of the pixels, and a center of the contact hole is on one side of the virtual center line.

2. The display device of claim 1, wherein
the virtual center line extends along a direction in which the data line extends.

3. The display device of claim 1, wherein
the opening of the color filter has a symmetrical shape in a plan view with respect to the virtual center line.

4. The display device of claim 1, wherein
an area of the contact hole in a plan view is smaller than an area of the opening in a plan view.

5. The display device of claim 1, wherein
a width of the opening is greater than a width of the contact hole.

6. The display device of claim 1, wherein
the center of the opening is not aligned with the center of the contact hole.

7. The display device of claim 1, further comprising
a storage electrode line disposed at a same layer as the gate line,
wherein the storage electrode line includes a protrusion overlapping the contact hole in a plan view.

8. The display device of claim 7, wherein:
the storage electrode line includes a horizontal portion extending parallel to the gate line, and
the protrusion protrudes from the horizontal portion.

9. The display device of claim 7, wherein
the protrusion overlaps the opening.

10. The display device of claim 1, further comprising
a shielding electrode at a same layer as the pixel electrode.

11. The display device of claim 10, wherein
the shielding electrode extends along a direction in which the gate line extends.

12. A display device comprising:
a substrate comprising a display area including pixels, and a peripheral area;

a gate line and a data line on the substrate, the gate line and the data line insulated from each other;

a thin film transistor connected to the gate line and the data line;

an organic layer;

a pixel electrode connected to the thin film transistor through a contact hole of the organic layer, the organic layer being between the thin film transistor and the pixel electrode;

a color filter overlapping the thin film transistor and the pixel electrode; and a dummy color filter in the peripheral area, wherein the color filter includes an opening overlapping the contact hole, and a center of the opening is not aligned with a center of the contact hole.

13. The display device of claim 12, wherein:
the center of the opening is on a virtual center line of one of the pixels,
the center of the contact hole is on one side of the virtual center line, and
the virtual center line extends along a direction in which the data line extends.

14. The display device of claim 12, wherein
an area of the contact hole in a plan view is smaller than an area of the opening in a plan view.

15. The display device of claim 12, wherein
the organic layer is between the color filter and the pixel electrode.

16. The display device of claim 12, further comprising
a storage electrode line at a same layer as the gate line,
wherein the storage electrode line includes a protrusion overlapping the contact hole in a plan view.

17. The display device of claim 16, wherein
the storage electrode line includes a horizontal portion extending parallel to the gate line, and
the protrusion protrudes from the horizontal portion.

18. The display device of claim 16, wherein
the protrusion overlaps the opening.

19. The display device of claim 12, further comprising
a shielding electrode at a same layer as the pixel electrode,
wherein the shielding electrode extends along a direction in which the gate line extends.

* * * * *